(12) United States Patent
Ishizaka et al.

(10) Patent No.: US 7,717,061 B2
(45) Date of Patent: May 18, 2010

(54) GAS SWITCHING MECHANISM FOR PLASMA PROCESSING APPARATUS

(75) Inventors: Tadahiro Ishizaka, Nirasaki (JP); Naoki Yoshii, Nirasaki (JP); Kohei Kawamura, Nirasaki (JP); Yukio Fukuda, Nakakoma-gun (JP); Takashi Shigeoka, Nirasaki (JP); Yasuhiko Kojima, Nirasaki (JP); Yasuhiro Oshima, Nirasaki (JP); Junichi Arami, Tokyo (JP); Atsushi Gomi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 581 days.

(21) Appl. No.: 11/232,943

(22) Filed: Sep. 23, 2005

(65) Prior Publication Data

US 2006/0027167 A1     Feb. 9, 2006

Related U.S. Application Data

(63) Continuation of application No. PCT/JP2004/003412, filed on Mar. 15, 2004.

(30) Foreign Application Priority Data

Mar. 25, 2003    (JP)   ............................. 2003-082976

(51) Int. Cl.
| | |
|---|---|
| C23C 16/00 | (2006.01) |
| C23F 1/00 | (2006.01) |
| H01L 21/306 | (2006.01) |
| F16K 11/065 | (2006.01) |
| F16K 11/085 | (2006.01) |
| F16K 11/074 | (2006.01) |
| F16K 3/08 | (2006.01) |
| F16K 47/04 | (2006.01) |

(52) U.S. Cl. .............................. 118/723 MP; 118/715; 118/723 ME; 118/723 ER; 118/723 IR; 156/345.33; 156/345.34; 156/345.35; 137/625.18; 137/625.19; 137/625.21; 137/625.29; 137/625.31; 137/625.32; 137/625.47

(58) Field of Classification Search ................. 118/715; 156/345.33, 345.34
See application file for complete search history.

(56) References Cited

U.S. PATENT DOCUMENTS

| | | | | |
|---|---|---|---|---|
| 4,818,223 | A | * | 4/1989 | Hild ............................ 432/205 |
| 5,313,984 | A | * | 5/1994 | Garwood et al. ........ 137/625.48 |
| 5,445,187 | A | * | 8/1995 | Farquhar ................ 137/625.32 |
| 5,601,651 | A | * | 2/1997 | Watabe ....................... 118/715 |

(Continued)

FOREIGN PATENT DOCUMENTS

| | | |
|---|---|---|
| JP | 3-134175 | 6/1991 |
| JP | 5-166733 | 7/1993 |
| JP | 2004-6699 | 1/2004 |
| WO | WO 2004/085703 | 7/2004 |

*Primary Examiner*—Parviz Hassanzadeh
*Assistant Examiner*—Rakesh Dhingra
(74) *Attorney, Agent, or Firm*—Oblon, Spivak, McClelland, Maier & Neustadt, L.L.P.

(57) ABSTRACT

A processing apparatus is disclosed which is capable of switching supplies of a raw material gas and a reducing gas alternately, while continuously forming a plasma of the reducing gas. An excitation device (12) excites a reducing gas supplied thereinto, and the excited reducing gas is supplied into a process chamber (2). A switching mechanism (20) is arranged between the excitation device (12) and the process chamber (2), and a bypass line (22) is connected to the switching mechanism (20). The switching mechanism (20) switches the flow of the excited reducing gas from the excitation device (12) between the process chamber (2) and the bypass line (22).

9 Claims, 14 Drawing Sheets

U.S. PATENT DOCUMENTS

| | | | |
|---|---|---|---|
| 5,647,945 A * | 7/1997 | Matsuse et al. | 156/345.38 |
| 6,387,207 B1 * | 5/2002 | Janakiraman et al. | 156/345.35 |
| 6,544,585 B1 * | 4/2003 | Kuriyama et al. | 216/18 |
| 6,884,738 B2 * | 4/2005 | Asai et al. | 438/758 |
| 2002/0073924 A1 * | 6/2002 | Chiang et al. | 118/723 R |
| 2004/0043544 A1 | 3/2004 | Asai et al. | |

* cited by examiner

FIG.5

| | | | | | | |
|---|---|---|---|---|---|---|
| TiCl₄ VALVE | OPEN | | CLOSE | | | |
| NH₃ VALVE | OPEN | | | | | |
| SWITCHING MECHANISM | BYPASS LINE SIDE | | PROCESSING VESSEL SIDE | | | |
| PLASMA IGNITION | ON | | | | | |

FIG.11

| | Taimata™ | CARRIER GAS | H₂ | Ar (H₂ SUPPLY SIDE) | RF POWER |
|---|---|---|---|---|---|
| FIRST STEP | 20[mg/min.] | 200[sccm] | 0[sccm] | 100[sccm] | — |
| SECOND STEP | — | — | 200[sccm] | 200[sccm] | — |
| THIRD STEP | — | — | 200[sccm] | 200[sccm] | 800[W] |
| FOURTH STEP | — | — | 200[sccm] | 0[sccm] | 800[W] |
| FIFTH STEP | — | — | 0[sccm] | 0[sccm] | — |

FIG.14

| | TaCl₅ | H₂ | Ar(H₂ SUPPLY SIDE) | RF POWER |
|---|---|---|---|---|
| FIRST STEP | 3 [sccm] | 0 [sccm] | 200 [sccm] | — |
| SECOND STEP | — | 0 [sccm] | 200 [sccm] | — |
| THIRD STEP | — | 750 [sccm] | 0 [sccm] | 1000 [W] |
| FOURTH STEP | — | 0 [sccm] | 0 [sccm] | — |

FIG.15

| | Ar [sccm] | NF3 [sccm] | PLASMA | SWITCHING THE FLOW PATH | TIME [sec] |
|---|---|---|---|---|---|
| FIRST STEP | 3000 | 230 | — | BYPASS LINE | 5 |
| SECOND STEP | 3000 | 230 | ON | BYPASS LINE | 10 |
| THIRD STEP | 3000 | 230 | ON | PROCESSING VESSEL | 750 |
| FOURTH STEP | 3000 | 0 | — | PROCESSING VESSEL | 30 |
| FIFTH STEP | 0 | 0 | — | PROCESSING VESSEL | 30 |
| SIXTH STEP | 3000 | 0 | — | PROCESSING VESSEL | 30 |
| SEVENTH STEP | 0 | 0 | — | PROCESSING VESSEL | 30 |

GAS SWITCHING MECHANISM FOR PLASMA PROCESSING APPARATUS

This application is a Continuation Application of PCT International Application No. PCT/JP04/003412 filed on Mar. 15, 2004, which designated the United States.

FIELD OF THE INVENTION

The present invention relates to a processing apparatus; and more particularly, to a processing apparatus having an excitation source, which produces an excited species by exciting a gas.

BACKGROUND OF THE INVENTION

With the recent trend of miniaturizing semiconductor devices, various processing methods capable of achieving more miniaturized structures have been proposed. Among them, a method for forming a thin film on a semiconductor substrate by using an excited species formed from exciting gas has been has drawn attention.

For example, as a method for forming a high quality thin film on a substrate by supplying a processing gas to a heated substrate under a depressurized atmosphere, ALD (Atomic Layer Deposition) has drawn considerable attention. In ALD, various species of source gases are alternately supplied to a substrate in a depressurized atmosphere. Then the gases react on the heated substrate, thereby forming a very thin film of reaction product. Although setting the substrate at high temperature is effective in promoting the reaction of the source gases on the substrate, raising the heating temperature of the substrate has a limit. For example, for a silicon wafer for semiconductor, preferably the temperature of the substrate is set at 400° C. or less.

Meanwhile, to promote the reaction of the source gases on the substrate at relatively low temperature, one technology uses excited species by exciting source gases. Various methods exist for producing excited species, but a method for converting the source gas into plasma is commonly used.

Further, in the wiring process of a semiconductor integrated circuit, formation of a barrier film is necessary to suppress copper (Cu) film as a wiring material from diffusing into the low dielectric interlayer insulating film (low-K film). As for forming the barrier film, TiN film, TaN film, WN film, Ti film, Ta film etc., are considered promising materials. It has been proposed that the barrier films are formed by using a processing gas which has been converted into plasma (for example, see reference 7 and article 1, as listed below).

References related to the technical background of the present invention are as follows:

Reference 1: Japanese Patent Laid-open Application No. H06-89873;
Reference 2: Japanese Patent Laid-open Application No. H06-333875;
Reference 3: Japanese Patent Laid-open Application No. H07-252660;
Reference 4: U.S. Pat. No. 5,306,666;
Reference 5: U.S. Pat. No. 5,916,365;
Reference 6: U.S. Pat. No. 6,342,277;
Reference 7: U.S. Pat. No. 6,387,207; and
Article 1: S. M. Rossnagel, A. Sherman, F. Turner, "Plasma-enhanced atomic layer deposition of Ta and Ti for interconnect diffusion barriers", J. Vac. Sci. Technol. July/August 2000, pp. 2016-2020

As an example method for forming Ti film by using a processing gas which has been converted into plasma, there is a method of using $TiCl_4$ as source gas and $H_2$ as reducing gas. In this method, Ti film is formed on a substrate, e.g., a wafer or the like, by alternately supplying $H_2$ as reducing gas and $TiCl_4$ as source gas, wherein reducing gas, $H_2$, is excited by ICP (Inductively Coupled Plasma) to be converted into plasma. Such a method is referred to as the PE-ALD method.

As described above, in a processing apparatus for forming Ti film by using the PE-ALD (Plasma-Enhanced Atomic Layer Deposition) method, the supply of $H_2$ is stopped while $TiCl_4$ is supplied, to thereby switch the supply of $H_2$ to $TiCl_4$. For that reason, the operation of ICP, which is an excitation source, is stopped while $H_2$ is not being supplied. In the PE-ALD method, since alternating supplies of $TiCl_4$ and $H_2$ are performed repeatedly over hundreds of times, ICP is stopped every time accordingly.

Here, if the operation of ICP is stopped and plasma is dissipated, to regenerate plasma for the next process, a time is necessary for plasma ignition. Further, once plasma has been ignited, more time is required for the plasma to reach a stable state. Therefore, every time the supplies of $TiCl_4$ and $H_2$ are alternated, it takes time to ignite and stabilize plasma, ultimately resulting in the problem of extending the overall processing time.

SUMMARY OF THE INVENTION

It is, therefore, a general object of the present invention to provide an improved and useful processing apparatus and method capable of resolving the aforementioned problem.

It is a more specific object of the present invention to provide a processing apparatus and method capable of alternately supplying source gas and reducing gas while continuously producing plasma of the reducing gas.

For achieving the aforementioned objects, in accordance with one aspect of the present invention, there is provided a processing apparatus including: an excitation device for exciting a processing gas to be supplied; a processing vessel into which an excited processing gas is supplied, the processing vessel being connected to the excitation device; a switching mechanism, provided between the excitation device and the processing vessel, for switching a flow of the excited processing gas from the excitation device; and a bypass line connected to the switching mechanism, wherein the switching mechanism changes the flow the excited processing gas from the excitation device into one of the processing vessel and the bypass line.

In the aforementioned invention, the switching mechanism may have two opening/closing valves that are synchronously operated. Instead of this, the switching mechanism may be a three-way valve. Further, the switching mechanism may be a rotational three-way valve whose valve body is continuously rotated in one direction to switch a flow path.

Still further, the processing vessel may be connected to a gas supply unit for supplying a process gas other than the excited processing gas, wherein the processing vessel may be configured to alternately supply therein the excited processing gas and the process gas other than the excited processing gas.

In accordance with another aspect of the present invention, there is provided a processing method including: a first process for exciting a processing gas to supply it into a processing vessel for a predetermined time; a second process for switching a flow of an excited processing gas from the processing vessel into a bypass line, and directing the excited processing gas to the bypass line for a predetermined time, both of which are carried out while continuously exciting the processing gas; and a third process for repeatedly performing the first and the second process.

In accordance with still another aspect of the present invention, there is provided a processing method including: a first process for supplying an excited first processing gas into a processing vessel for a predetermined time; a second process for switching a flow of the excited first processing gas from the processing vessel into a bypass line, and directing the excited first processing gas to the bypass line for a predetermined time, both of which are carried out while continuously exciting the first processing gas; a third process for supplying a second processing gas into the processing vessel for a predetermined time; a fourth process for switching the flow of the excited first processing gas from the bypass line into the processing vessel, and directing the excited first processing gas to the processing vessel for a predetermined time, both of which are carried out while continuously exciting the first processing gas; and a fifth process for repeatedly performing the first through fourth processes.

In accordance with the aforementioned present invention, the processing gas can be continuously supplied into the excitation device and continuously excited therein, even while the process gas other than the processing gas to be excited is supplied into the processing vessel. As a result, even while the process gas other than the processing gas to be excited is supplied into the processing vessel, the excitation of the processing gas need not be stopped, and thus, it becomes unnecessary to reserve time to re-ignite and stabilize plasma when plasma generation is regularly interrupted. Therefore, the overall processing time is reduced, ultimately reducing the processing cost.

BRIEF DESCRIPTION OF THE DRAWINGS

The above and other objects and features of the present invention will become apparent from the following description of preferred embodiments given in conjunction with the accompanying drawings, in which:

FIG. 5 is a time chart, which shows the operation statuses of opening/closing valves and switching mechanisms in the processes performed in the processing apparatus shown in FIG. 1;

FIG. 11 is a table showing supply amounts (flow rates) of source gases and RF outputs applied to an excitation device;

FIG. 14 is a table showing supply amounts (flow rates) of source gases and RF outputs applied to an excitation device; and FIG. 15 is a table for explaining the cleaning process.

DETAILED DESCRIPTION OF THE PREFERRED EMBODIMENT

Figure 1:
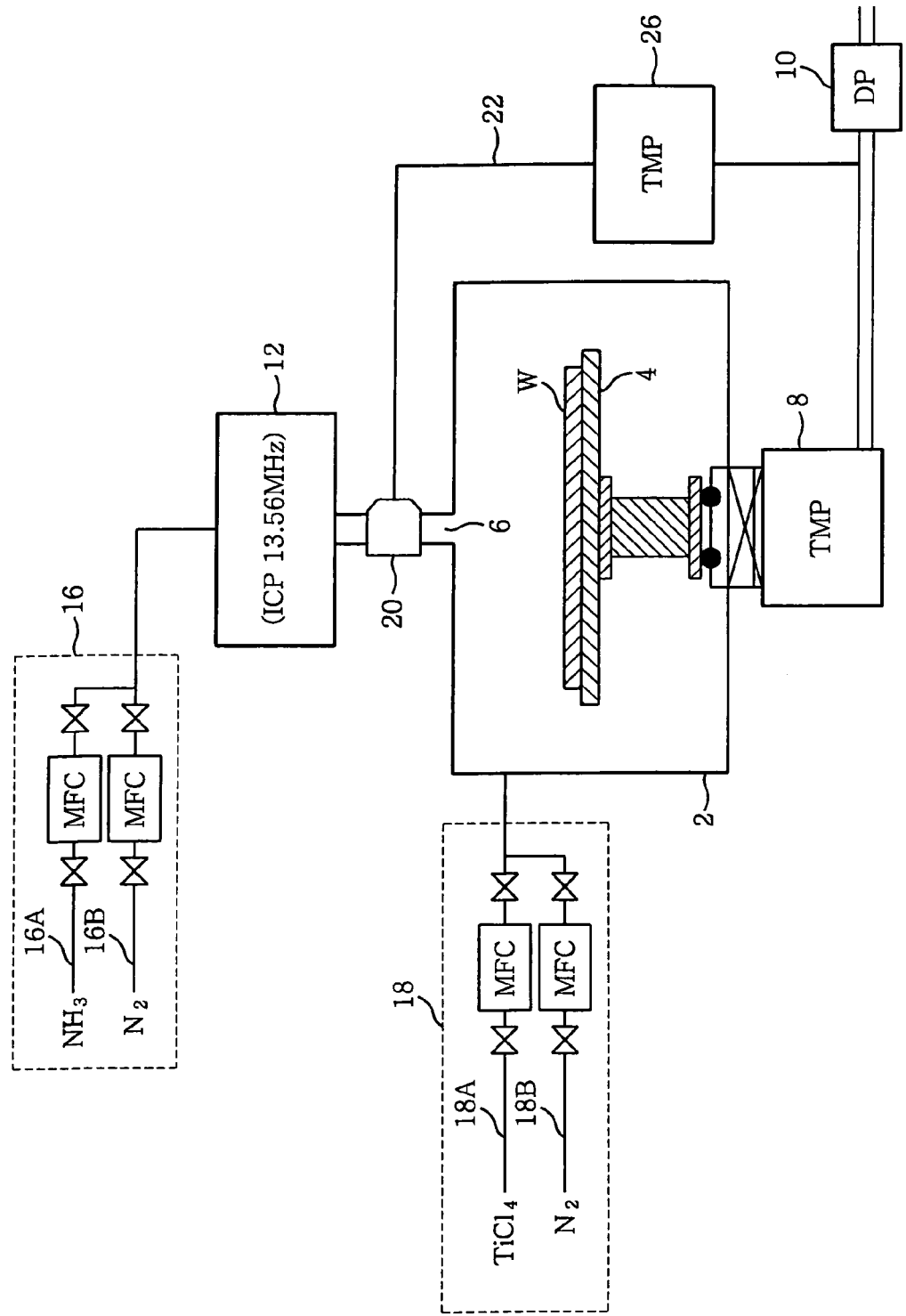
FIG. 1 shows an overall configuration of a processing apparatus in accordance with a first embodiment of the present invention.

Hereinafter, a processing apparatus in accordance with a first embodiment of the present invention will be described with reference to FIG. 1. FIG. 1 shows the overall configuration of the processing apparatus in accordance with the first embodiment of the present invention.

The processing apparatus shown in FIG. 1 is capable of forming a thin film on a wafer W as a substrate to be processed in a processing vessel 2 by alternately introducing thereinto various species of source gases (processing gases). In the processing vessel 2, a mounting table 4 for mounting thereon the wafer W is disposed. A gas supply port 6 is disposed above a mounting surface of the mounting table 4. $NH_3$ as reducing gas (processing gas) is introduced into a processing space inside the processing vessel 2 through the gas supply port 6.

Further, a turbo molecular pump (TMP) 8 as gas exhaust unit is connected to a bottom portion of the processing vessel 2 to maintain the processing space in the processing vessel 2 in a predetermined depressurized environment. The turbo molecular pump 8 is connected to a dry pump (DP) 10; and gas discharged from the turbo molecular pump 8 is exhausted to the outside from the dry pump 10 through a waste gas scrubber (not shown) or the like.

In the present embodiment, $TiCl_4$ as source gas (processing gas) is supplied into the processing space in the processing vessel 2 from a sidewall of the processing vessel 2. Further, $TiCl_4$ as source gas and $NH_3$ as reducing gas are alternately supplied into the processing vessel 2, and introduced thereinto accordingly.

For supplying excited species of $NH_3$ into the processing vessel 2, an excitation device 12 as an excitation source is connected to the gas supply port 6. Namely, $NH_3$ is introduced into the excitation device 12; energy is injected into $NH_3$ to produce its excited species; and the produced excited species are supplied to the gas supply port 6. As a method for producing excited species of $NH_3$, a method for producing high frequency or ECR plasma, or a method for exciting by using UV rays can be employed.

In the present embodiment, excited species are produced by using plasma produced in an excitation vessel 14 of the excitation device 12, wherein the excitation device 12 works as a high frequency plasma generating device (ICP).

Figure 2:
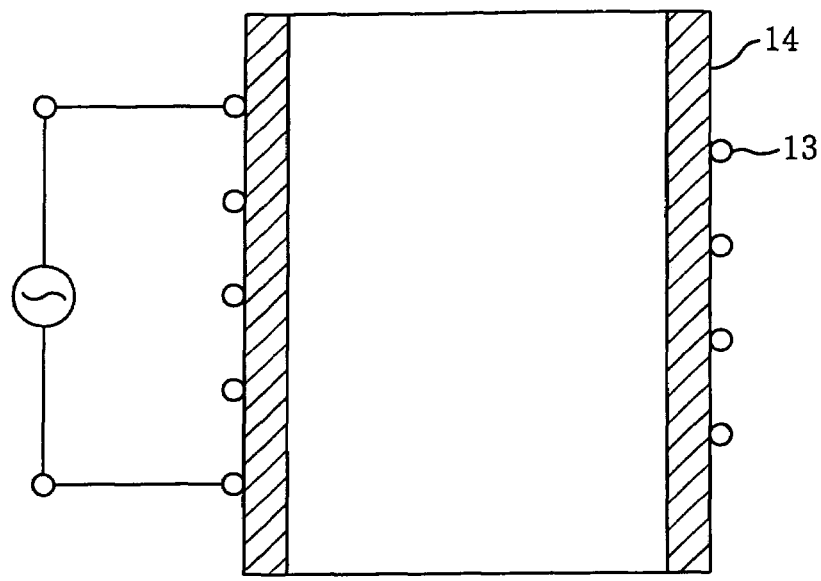
FIG. 2 is a schematic configuration of a high frequency plasma generating device, which can be used as an excitation device shown in FIG. 1.

When the high frequency plasma generating device is used as the excitation device 12, as described in FIG. 2, the excitation vessel 14 is formed in a cylindrical shape; an electric coil 13 is provided on an outer side thereof to generate high frequency electric field inside the excitation vessel 14; and thus, excitation energy can be discharged from the outside of the excitation vessel 14. Therefore, it becomes unnecessary to provide additional parts inside the excitation vessel 14, so long as the excitation vessel 14 has therein a space where the source gas is converted into plasma. As a result, such a problem is eliminated that the source gas is contaminated by the additional parts provided in the gas-excitation space.

Further, the processing apparatus in accordance with the present embodiment is configured such that oxygen is not discharged into a space where excited species are produced, making the apparatus suitable for processing for reduction. For achieving such a configuration, the excitation vessel 14 in which plasma is produced is formed of a nitride material which does not contain any oxygen. As for the nitride material, silicon nitride (SiN), aluminum nitride (AlN) or the like may be used preferably. When plasma is produced by using high frequency excitation, silicon nitride having high oxidation resistance or sputter resistance may be employed further preferably.

As mentioned above, the excitation vessel 14 forming the excitation space is formed of a nitride material, so that oxygen is not discharged from the excitation vessel 14 during the excitation of the source gas such as $NH_3$ or the like, and thus, excited species of oxygen are not produced. Hence, it is possible to prevent problems caused by excited species of oxygen during the processing for reduction.

Further, the processing vessel 2, the mounting table 4, the gas supply port 6 and the like, all of which contact with the processing space, may be formed of aluminum oxide ($Al_2O_3$) and the like. Here, there is no concern that the materials themselves would sputter, like in the excitation vessel 14, but it is preferable that an anodic oxidized film is formed on the surface of aluminum oxide, and further, a sealing treatment is done thereon to prevent adsorbed oxygen or other gases on the surface from being discharged.

In the present embodiment, $NH_3$, which is converted into plasma to produce excited species among various species of source gases, is supplied into the excitation device 12 from a first source gas supply unit 16. Meanwhile, $TiCl_4$, which need not be converted into plasma, is supplied into the processing vessel 2 from a second source gas supply unit 18.

The first source gas supply unit 16 has a supply line 16A for supplying $NH_3$ as source gas, $NH_3$ having a reducing effect as excited species. As for source gases having a reducing effect besides $NH_3$, there are, for example, $N_2$, $H_2$, $NH_3$, $N_2H_2$, $SiH_2$, $SiH_4$, $Si_2H_4$, $PH_3$, $AsH_3$ etc. Further, the first source gas supply unit 16 has a supply line 16B for supplying $N_2$ as carrier gas together with $NH_3$. In each of the supply lines 16A and 16B, an opening/closing valve and a mass flow controller (MFC) for controlling flow rate are installed.

The second source gas supply unit 18 has a supply line 18A for supplying $TiCl_4$ as source gas. Further, the second source gas supply unit 18 has a supply line 18B for supplying $N_2$ as carrier gas. In each of the supply lines 18A and 18B, an opening/closing valve and a mass flow controller (MFC) for controlling flow rate are installed.

Here, $NH_3$ is referred to as reducing gas, but it can be considered as source gas species. Namely, in the present embodiment, at least one source gas species among various source gas species is converted into plasma to form excited species, and produced excited species are introduced into the processing space in the processing vessel 2. The excited species react with a source gas or a source gas adsorbed on the wafer W in the processing vessel 2 so a desired process is performed on the wafer W mounted on the mounting table 4.

In the present embodiment, when various species of source gases are being supplied alternately and individually, it is important to reduce the overall processing time by cutting the switching time for the source gases as much as possible.

In the present embodiment, $NH_3$ is converted into plasma by the excitation device 12, and the excited species of $NH_3$ is supplied into the processing vessel 2. While $TiCl_4$ is being supplied into the processing vessel 2, $NH_3$ supply into the vessel is suspended. Hence, in the conventional processing apparatus, the generation of $NH_3$ plasma is suspended while $TiCl_4$ is supplied into the processing vessel 2. However, in the present embodiment, a switching mechanism 20 is provided between the excitation device 12 and the gas supply port 6 of the processing vessel 2, so that excited species of $NH_3$ is directed to a bypass line 22 when it is not supplied into the processing vessel 2.

To elaborate, the switching mechanism 20 allows the excited species of $NH_3$, which comes from the excitation device 12, to be supplied into either the gas supply port 6 of the processing vessel 2 or the bypass line 22. The bypass line 22 is connected to a gas exhaust line which is disposed between the turbo molecular pump 8 and the dry pump 10; and $NH_3$ supplied to the bypass line 22 is exhausted through the dry pump 10.

Accordingly, $NH_3$ is continuously supplied into the excitation device 12 from the first source gas supply device 16 and converted into plasma, and its excited species is continuously supplied into the switching mechanism 20. Further, while $TiCl_4$ is being supplied into the processing vessel 2 from the second source gas supply unit 18, the flow of excited species of $NH_3$ is switched to the bypass line 22 by the switching mechanism 20. That is, the excited species of $NH_3$ is exhausted through the bypass line 22 while $TiCl_4$ is being supplied into the processing vessel 2.

Figure 3:
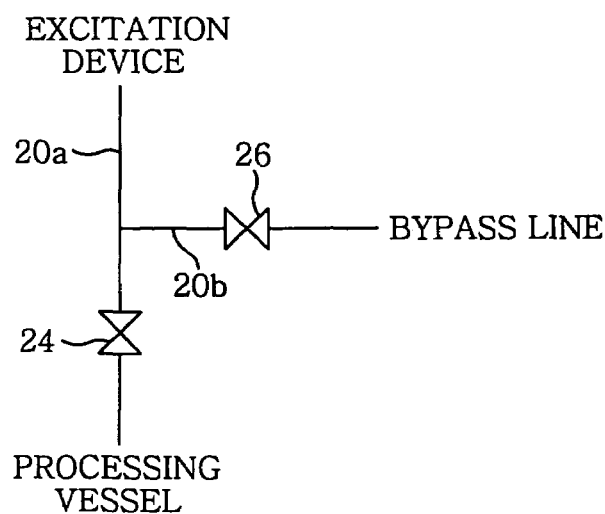
FIG. 3 is an exemplary switching mechanism shown in FIG. 1.

The switching mechanism 20 may be configured as in FIG. 3, for example. The switching mechanism 20 described in FIG. 3 has a passageway 20a connecting the excitation device 12 and the gas exhaust port 6 of the processing vessel 2. In the passageway 20a, an opening/closing valve 24 is installed to open or close the passageway 20a. The passageway 20b connected to the bypass line 22 is coupled to an excitation device 12 side from the opening/closing valve 24 in the passageway 20a. Further, in the passageway 20b, an opening/closing valve 26 is installed to open or close the passageway 20b.

In the switching mechanism 20 shown in FIG. 3, by opening the opening/closing valve 24 and closing the opening/closing valve 26, excited species of $NH_3$, which is supplied from the excitation device 12, is directed to the gas supply port 6 of the processing vessel 2. On the other hand, by closing the opening/closing valve 24 and opening the opening/closing valve 26, excited species of $NH_3$, which is supplied from the excitation device 12, is directed to the bypass line 22. At this time, it is preferable that the opening/closing valves 24 and 26 are synchronously controlled.

Further, a three-way valve can be provided, which is capable of performing as one valve unit the operation of the switching mechanism 20 shown in FIG. 3. Accordingly, it is unnecessary to synchronously control two opening/closing valves, thereby simplifying the configuration of the apparatus.

In the processing apparatus having the aforementioned switching mechanism 20 of the present embodiment, $NH_3$ is supplied continuously to the excitation device 12 so that plasma of $NH_3$ is continuously generated, even while $TiCl_4$ is supplied into the processing vessel 2. To elaborate, even while $TiCl_4$ is being supplied into the processing vessel 2, generation of $NH_3$ plasma need not be stopped, and thus, it becomes unnecessary to reserve time to re-ignite and stabilize plasma when plasma generation is regularly interrupted. Therefore, the overall processing time is reduced, ultimately reducing the processing cost.

Figure 4:
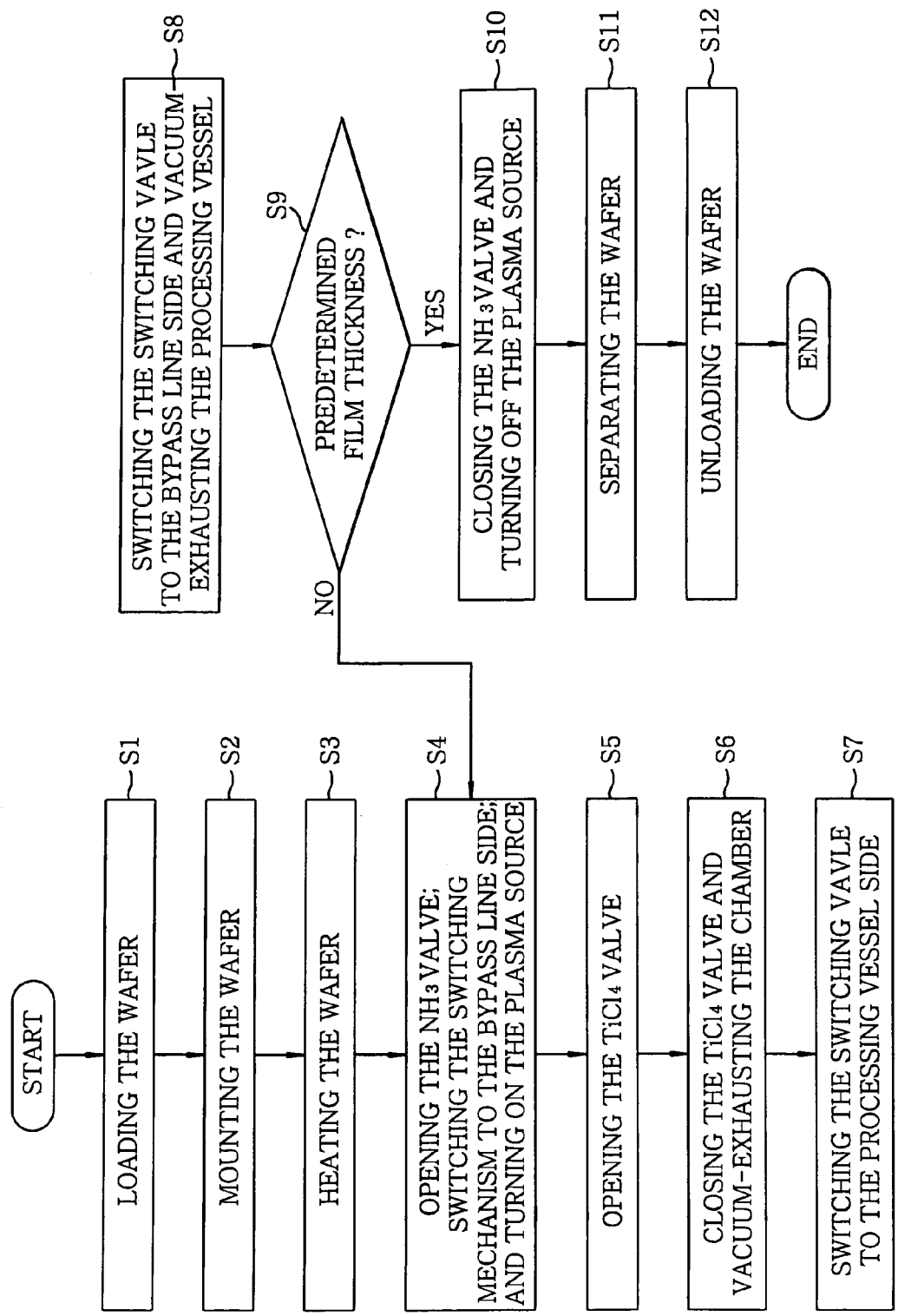
FIG. 4 is a flowchart of processes performed in the processing apparatus shown in FIG. 1.

Next, a processing performed in the processing apparatus as shown in FIG. 1 will be explained with reference to FIGS. 4 and 5. FIG. 4 is a flowchart of processing performed in the processing apparatus shown in FIG. 1. FIG. 5 is a time chart which shows operation statuses of the opening/closing valve and the switching mechanism in the processing performed in the processing apparatus shown in FIG. 1.

First, the wafer W is loaded into the processing vessel 2 in step S1, and mounted on the mounting table 4 in step S2. Then, the mounting table 4 is heated to heat the wafer W to a specified temperature, e.g., 400° C., and the inside of the processing vessel 2 is vacuum-exhausted to a predetermined vacuum level, in step S3.

Next, in step S4, the opening/closing valve for supplying $NH_3$ (the opening/closing valve of the first source gas supply unit 16) is opened, and at the same time, the excitation device 12 is operated. Simultaneously, the switching mechanism 20 is switched to the bypass line 22 side. Accordingly, $NH_3$ is supplied into the excitation device 12 and converted into plasma, and excited species of $NH_3$ from the excitation device 12 is directed to the bypass line 22 via the switching mechanism 20.

Subsequently, the opening/closing valve for supplying $TiCl_4$ (the opening/closing valve of the second source gas supply unit 18) is opened to supply $TiCl_4$ into the processing vessel 2, in step S5. $TiCl_4$ supplied into the processing vessel 2 is adsorbed on the surface of the wafer W. After $TiCl_4$ is supplied for a predetermined time, the opening/closing valve for supplying $TiCl_4$ is closed to vacuum-exhaust the inside of the processing chamber, thereby discharging residual $TiCl_4$ from the processing vessel 2, in step S6.

Next, in step S7, the switching mechanism 20 is switched to the processing vessel 2 side. Accordingly, excited species of $NH_3$ from the excitation device 12 is supplied into the processing vessel 2 through the switching mechanism 20. The excited species of $NH_3$ supplied into the processing vessel 2 reacts with $TiCl_4$, which has been adsorbed on the wafer W, the reaction resulting in a TiN film on the wafer W.

After excited species of $NH_3$ is supplied for a predetermined time, the switching mechanism 20 is switched to the bypass line side, and the inside of the processing chamber is vacuum-exhausted to discharge reaction by-products and unreacted $NH_3$ from the processing vessel 2, in step S8.

Subsequently, in step S9, whether the film thickness on the wafer W attained a desired film thickness is determined. If the film thickness is determined not to be the predetermined film thickness, the processing returns to step S4 to repeat steps S4~S9. In step S9, if the film thickness is determined to be a desired film thickness, the processing proceeds to step S10.

In step S10, the opening/closing valve for supplying $NH_3$ is closed, and the operation of the excitation device 12 is stopped. Further, the wafer W is lifted up from the mounting table 4 in step S11; and it is unloaded from the processing vessel 2 in step S12, and thus the processing is completed.

In the above-described processings, as shown in FIG. 5, if the processing is started and plasma of $NH_3$ is produced in the excitation device 12, plasma of $NH_3$ is continuously produced until the processing is terminated. The supply of excited species of $NH_3$ is alternated between the processing vessel 2 and bypass line 22 sides by the switching mechanism 20, so that $TiCl_4$ and $NH_3$ can be alternately supplied into the processing vessel 2.

Since plasma of $NH_3$ is produced continuously, the condition for producing plasma can be stabilized, and therefore, uniform plasma can be produced without any variation. Further, since the time reserved for igniting and stabilizing plasma becomes unnecessary, it is possible to reduce the overall processing time.

Next, a processing apparatus in accordance with a second embodiment of the present invention will be discussed. A configuration of the processing apparatus in accordance with the second embodiment of the present invention is the same as in FIG. 1, except that the switching mechanism 20 is replaced by a rotational three-way valve, and the explanation thereof is omitted.

Figure 6:
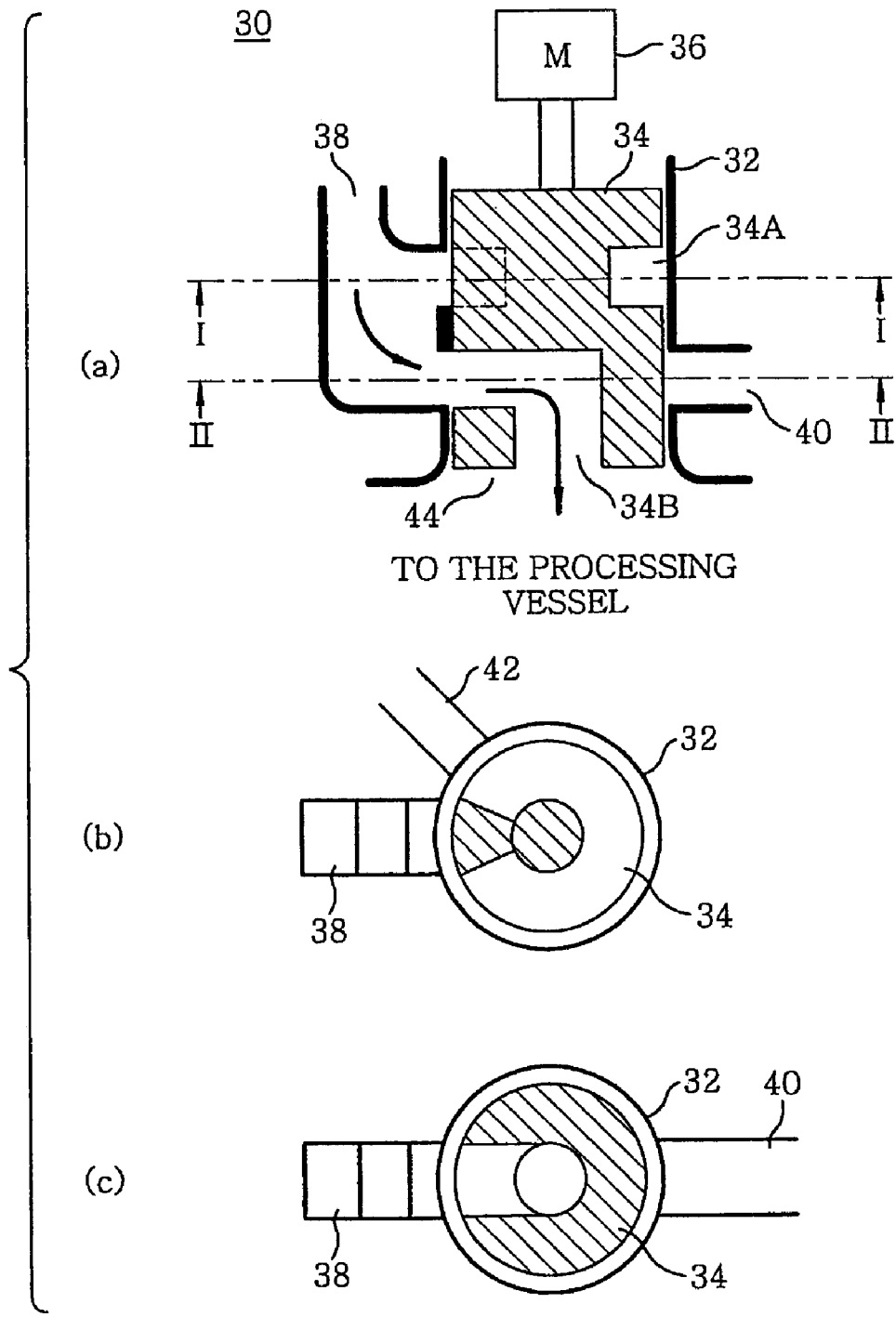
FIGS. 6(a)-6(c) are schematic diagrams showing a rotational three-way valve provided in a processing apparatus in accordance with a second embodiment of the present invention.

FIGS. 6(a)-6(c) are schematic diagrams showing a rotational three-way valve 30 provided in the processing apparatus in accordance with the second embodiment of the present invention: FIG. 6(a) is a vertical cross section; FIG. 6(b) is a cross section taken along I-I line; and FIG. 6(c) is a cross section view taken along II-II line.

The rotational three-way valve 30 as described in FIGS. 6(a)-6(c) is a switching valve for alternately supplying TlC14 and plasma of NH3+N2; and it is provided to replace the switching mechanism 20 in the configuration shown in FIG. 1.

The rotational three-way valve 30 includes a cylinder 32; a rotation valve 34 rotatably provided in the cylinder 32; and a motor mechanism 36 for rotating and driving the rotation valve 34. In the cylinder 32, there are provided a plasma supply passageway 38 for supplying plasma of $NH_3+N_2$, and a processing gas supply passageway 40 for supplying $TiCl_4$. Further, in the cylinder 32, there is installed a plasma exhaust passage 42 for exhausting plasma without running through the processing vessel 2, when plasma is not supplied into the processing vessel 2. The cylinder 32 also includes a passageway 44 that is open to the processing vessel 12.

The plasma supply passageway 38 is connected to the excitation device 12 as a plasma supply source, and from the excitation device 12, plasma of $NH_3+N_2$ is continuously supplied. The processing gas supply passageway 40 is connected to the second source gas supply unit 18, from which $TiCl_4$ is supplied. Further, the plasma exhaust passage 42 is connected to the bypass line 22, and plasma running therethrough is exhausted by the dry pump 10 which is for exhaustion.

The rotation valve 34 has an annular passageway 34A for directing plasma supplied from the plasma supply passageway 38 to the plasma exhaust passage 42; and a central passageway 34B for alternately directing $TiCl_4$ and plasma to the processing chamber 2.

The annular passageway 34A is of a groove-shaped passageway, which is circumferentially formed around almost the entire periphery of the rotation valve 34 except for a portion thereof. At a different position (lower level) from the annular passageway 34A, the central passageway 34B composed of a horizontal passageway extending from a peripheral portion to the center portion, and a vertical passageway extending along the axial direction from the center of the bottom surface are formed. The passageway 44 of the cylinder 32 connects the vertical passageway of the central passageway 34B to the processing vessel 2.

Figure 7:
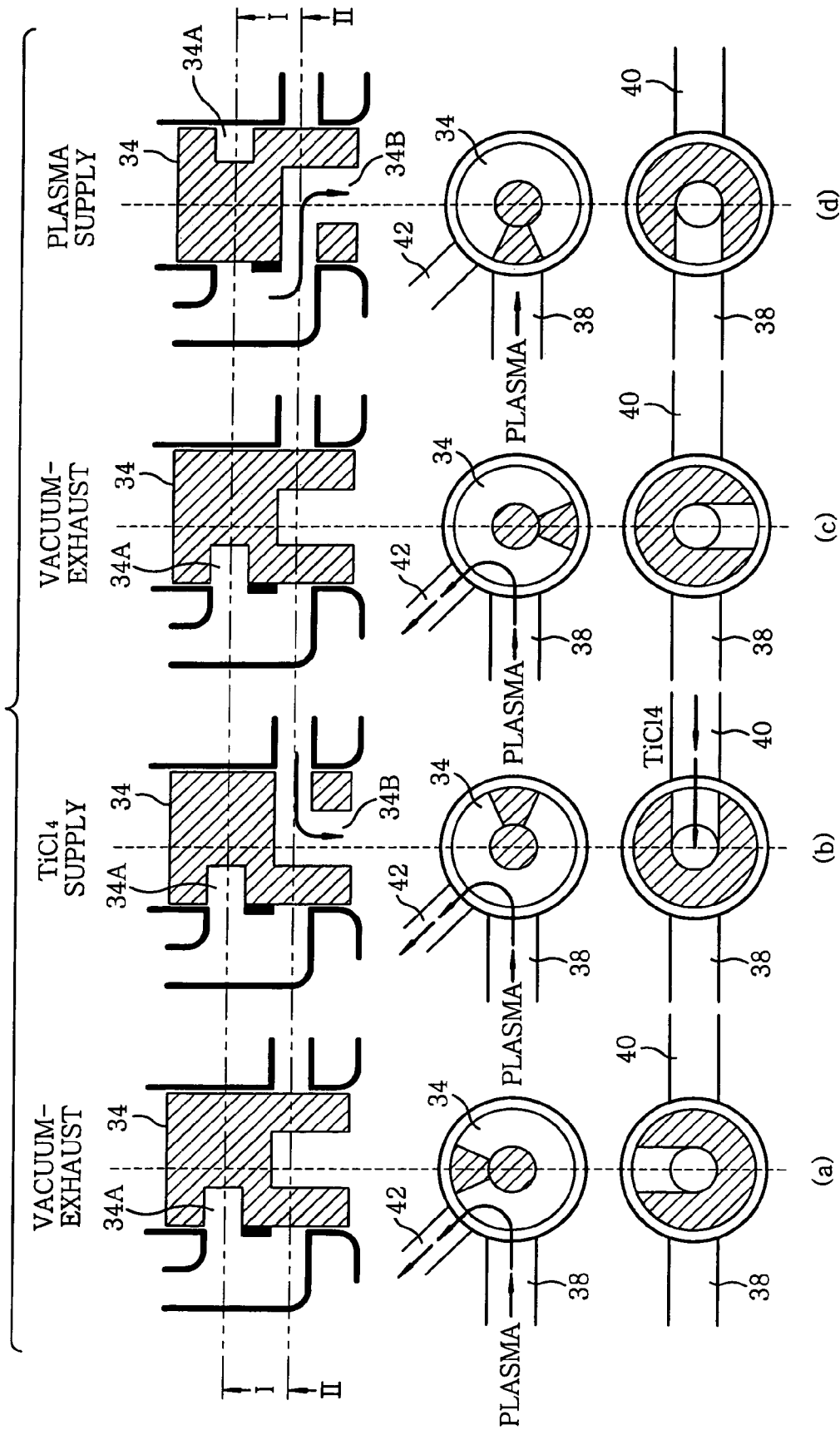
FIGS. 7(a)-7(d) are diagrams showing the relationship between operation of the rotation valve and gas supply status.
Figure 8:
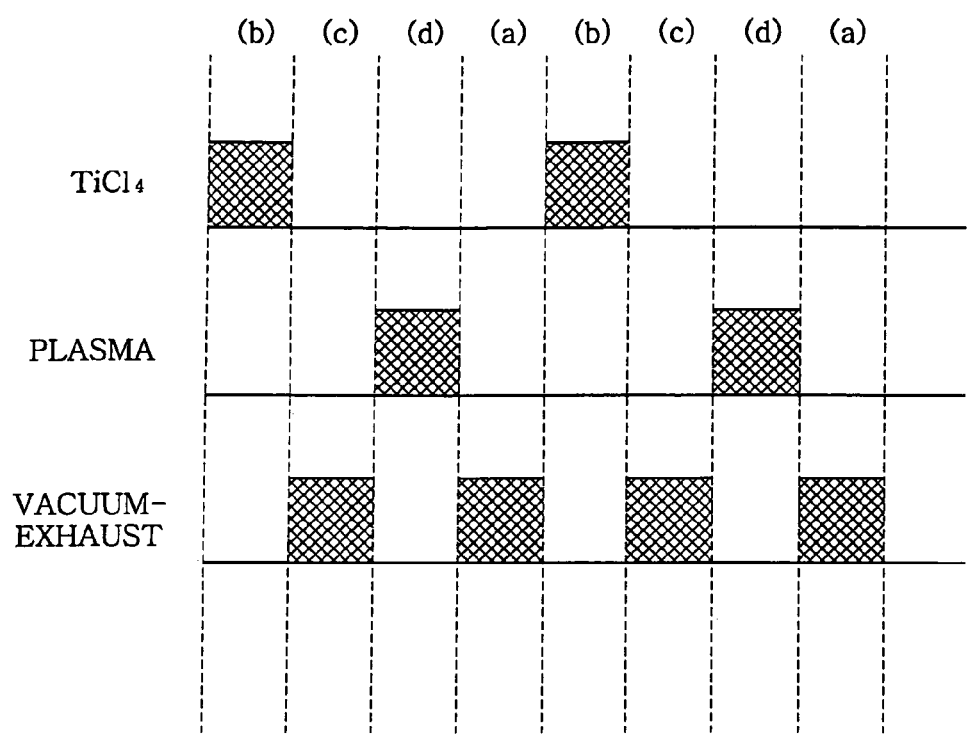
FIG. 8 is a time chart showing the supply operation of gases into a processing vessel.

Hereinafter, operations of the rotational three-way valve 30 will be explained with reference to FIGS. 7 and 8. FIG. 7 is a diagram showing operations of the rotation valve and gas supply statuses. FIG. 8 is a time chart showing the gas supplying statuses into the processing vessel 2.

When the rotation valve 34 is rotated by the motor mechanism 36 to be positioned as shown in FIG. 7(a), plasma supplied from the plasma supply passageway 38 is directed to the plasma exhaust passage 42 via the annular passageway 34A. At this time, since the opening of the central passageway 34B of the rotation valve 34 is positioned between the plasma supply passageway 38 and the processing gas supply passageway 40, neither plasma nor TiCl4 is supplied into the processing vessel 2. Thus, in the state as shown in FIG. 7(a), neither plasma nor TlC14 is supplied through the rotational three-way valve 30, and residual processing gas or reaction i by-product in the processing vessel 2 is exhausted by the turbo molecular pump 8 (vacuum exhausted). Such a state is indicated by (a) as shown in FIG. 8.

Subsequently, if the rotation valve 34 is rotated to be positioned as shown in FIG. 7(b), the opening of the central passageway 34B then communicates with the processing gas supply passageway 40 while the plasma supply passageway 38 communicates with the plasma exhaust passage 42 via the annular passageway 34A. Therefore, TlC14 is supplied into the processing vessel 2 through the central passageway 34B. At this time, plasma being supplied into the plasma supply passageway 38 is directed to the plasma exhaust passage 42 through the annular passageway 34A, and thus being exhausted. This state is indicated by (b) as shown in FIG. 8.

If the rotation valve 34 is further rotated to be) positioned as shown in FIG. 7 the opening of the central passageway 34B is not aligned with the processing gas supply passageway 40, and thus, TlC14 supply into the processing vessel 2 is suspended. Even at this time, the plasma being supplied into the plasma supply passageway 38 is directed to the plasma exhaust passage 42 through the annular passageway 34A. Accordingly, in the state as shown in FIG. 7(c) neither plasma nor TiCl4 is supplied through the rotational three-way valve 30, and residual TlC14 or reaction by-product in the processing vessel 2 is exhausted by the turbo molecular pump 8 (vacuum-exhausted). This state is indicated by (c) as shown in FIG. 8.

Subsequently, if the rotation valve 34 is further rotated to be positioned as shown in FIG. 7, the opening of the central passageway 34B communicates with the plasma supply passageway 38, and the portion where the annular passageway 34A is not formed is aligned with the opening of the plasma supply passageway 38. Accordingly, the plasma supplied into the plasma supply passageway 38 is not directed to the plasma exhaust passage 42 through the annular passageway 34A, and instead, it flows towards the processing vessel 2 through the central passageway 34B. This state is indicated by (d) as shown in FIG. 8.

As the aforementioned operations are carried out, one rotation of the rotation valve 34 is completed. The rotation valve 34 is continuously rotated by the motor mechanism 36; and the same operations are repeated to supply $TiCl_4$ and plasma of $NH_3+N_2$ alternately while performing therebetween vacuum exhaustion.

In the operations as mentioned above, plasma is supplied at all times to the rotational three-way valve 30. To elaborate, while the plasma is continuously supplied to the rotational three-way valve 30, it is merely supplied into either the processing vessel 2 or exhausted to the exhaust line alternately. Accordingly, it is possible to supply plasma continuously without repeatedly reigniting and stopping plasma in the excitation device 12 as a plasma supply source. Hence, plasma ignition is not carried out under an unstable state, so that continuously and stably produced uniform plasma can be supplied into the processing vessel 2 intermittently.

Further, it becomes possible to perform vacuum-exhaustion, supplying of processing gas, and supplying of plasma alternately by using merely one rotational three-way valve. Therefore, it is unnecessary to synchronously operate plural opening/closing valves, and processing gases can be alternately supplied with a simple configuration, which is an advantage of the instant invention.

In the aforementioned processing, the source gas in the processing vessel 2 has been exhausted only by vacuum exhaustion, but it may be exhausted by purging with nonreactive gas such as $N_2$, Ar, He or the like. Further, a combination of vacuum exhaustion and purging may be used.

Below are the process conditions for actually forming TiN film by using the aforementioned processing apparatus and TiN film forming process:

Temperature of substrate (wafer): 400° C.;
Flow rate of $TiCl_4$ to be supplied: 30 sccm;
Flow rate of $NH_3$ to be supplied: 200 sccm;
RF power: 200 W;
Flow rate of $N_2$ carrier gas to be supplied: 2000 sccm; and
A method for exhausting a source gas: vacuum exhaust.
Further, a time sequence for growth is described below
Time for supplying $TiCl_4$: 5 seconds;
Time for vacuum exhaustion: 5 seconds;
Time for supplying $NH_3$: 5 seconds;
Vacuuming time: 5 seconds; and
The number of cycles for growth: 200 cycles.

Further, Ar or He gas was supplied with the reducing gas into the excitation device during the plasma ignition step.

As a result of forming TiN film by using the process conditions and the time sequence for growth as described above, TiN film of 9 nm thickness and 180 μΩcm resistivity could be obtained. Such TiN film had uniform film thickness and superior step coverage, and contained only minimal impurities (F, Cl or the like).

In the above-described example, TiN film as a barrier metal film of low resistance was formed by alternately supplying $TiCl_4$ and $NH_3$. However, the processing apparatus in accordance with the present invention may be employed for forming other barrier metal films such as Ti film, Ta film, TaN film, WN film or the like.

In case of forming Ti film or TiN film, there may be used, as Ti containing source gas, $TiCl_4$, $TiF_4$, $TiI_4$, $Ti[N(C_2H_5CH_3)]_4$(TEMAT), $Ti[N(CH_3)_2]_4$(TDMAT), $Ti[N(C_2H_5)_2]_4$(TEDMAT) or the like; and there may be used, as hydrogen nitride based source material, a combination of $H_2$, $SiH_4$, $Si_2H_6$, $SiH_2Cl_2$, $SiCl_4$, $NH_3$, $N_2H_4$, $NH(CH_3)_2$, $N_2H_3CH_3$, $N_2/H_2$ and the like.

In case of forming Ta film, TaN film, or TaCN film, there may be used, as Ta containing source gas, $TaCl_5$, $TaF_5$, $TaBr_5$, $TaI_5$, $Ta(NC(CH_3)_3)(N(C_2H_5) 2)_3$(TBTDET), $Ta(NC(CH_3)_2 C_2H_5)(N(C H_3)_2)_3$ or the like; and there may be used, as reducing gas, a combination of $H_2$, $SiH_4$, $Si_2H_6$, $SiH_2Cl_2$, $SiCl_4$, $NH_3$, $N_2H_4$, $NH(CH_3)_2$, $N_2H_3CH_3$, $N_2/H_2$ and the like.

In case of forming WN film, there may be used, as W containing source gas, $WF_6$ or the like; and there may be used, as reducing gas, a combination of $H_2$, $SiH_4$, $Si_2H_6$, $SiH_2Cl_2$, $SiCl_4$, $NH_3$, $N_2H_4$, $NH(CH_3)_2$, $N_2H_3CH_3$ and the like.

Further, the processing apparatus in accordance with the present invention may be used for forming a thin film, such as $HfO_2$, $ZrO_2$, $Ta_2O_5$, $Al_2O_3$ or the like, as a gate insulating film of a semiconductor device, or an insulating film for capacitors.

Next, a TaN film formation employing the film forming method in accordance with the present invention will be discussed.

Figure 9:
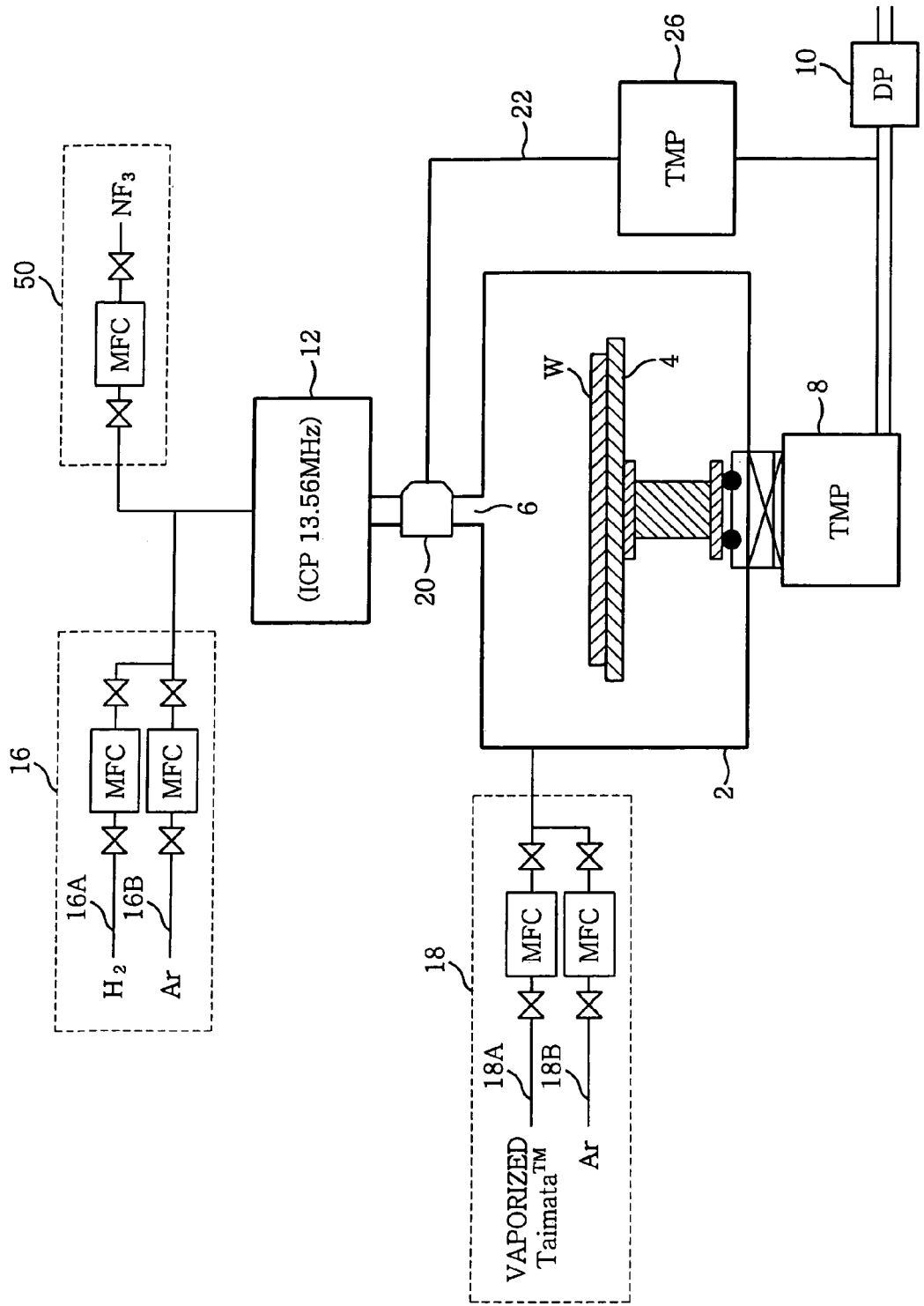
FIG. 9 shows an overall configuration of a processing apparatus in accordance with a third embodiment of the present invention.

FIG. 9 describes an overall configuration of a processing apparatus in accordance with a third embodiment of the present invention. The processing apparatus shown in FIG. 9 is to form a film, e.g., TaN film. In FIG. 9, identical reference numerals will be used for same parts as in FIG. 1, and explanations thereof will be omitted.

In the present embodiment, when forming TaN film, there are used $Ta(NC(CH_3)_2C_2H_5)(N(CH_3)_2)_3$ as Ta containing source gas, $H_2$ as reducing gas, and Ar as carrier gas. Ta(NC (CH$_3$)$_2$C$_2$H$_5$)(N(CH$_3$)$_2$)$_3$ is on the market with a brand name of Taimata (registered trademark). Below, it is referred to as ⌜rTaimata™⌝.

The processing apparatus in accordance with the present embodiment has the same configuration basically as in FIG. 1, but it is different concerning the supply parts of source and reducing gases. Further, in the apparatus in accordance with the present embodiment, a cleaning mechanism is provided as will be explained below.

In a second source gas supply unit 18, vaporized Taimata™ is supplied to a supply line 18A. Further, Ar as carrier gas is supplied to a supply line 18B. Vaporized Taimata™ and carrier gas are supplied from the second source gas supply unit 18 to the processing vessel 2 at a predetermined timing.

Meanwhile, in a first source gas supply unit 16, H$_2$ as reducing gas is supplied to a supply line 16A, and Ar as carrier gas is supplied to a supply line 16B. H$_2$ and Ar are supplied from the first source gas supply unit 16 to the excitation device 12.

H$_2$ supplied to the excitation device 12 is excited and converted into plasma, and supplied to the processing vessel 2 through the switching mechanism 20 at a predetermined timing.

Formation of TaN film according to the aforementioned processing apparatus is carried out under a control arrangement such that the switching mechanism 20 shown in FIG. 9 is to supply into the processing vessel 2 Ar and H$_2$ that have been converted into plasma. In other words, the bypass line 22 is not used.

Figure 10:
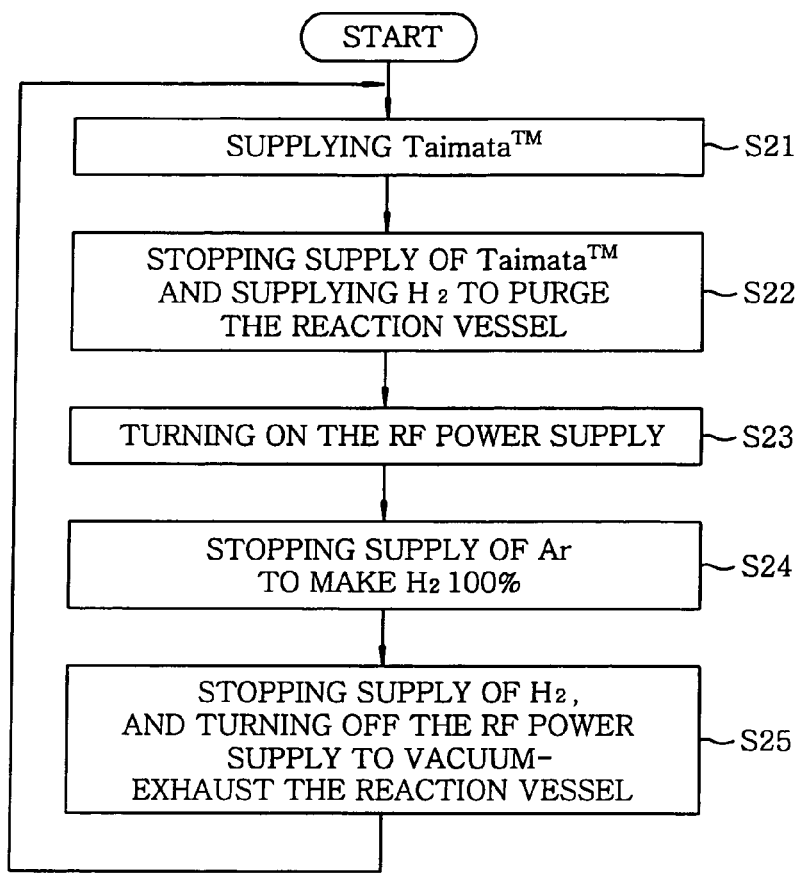
FIG. 10 is a flowchart of source gas supplying operation in the TaN film forming process.

FIG. 10 is a flowchart of source gas supplying operation in the TaN film forming process. FIG. 11 shows supply amounts (flow rate) of source gas and RF outputs applied to the excitation device 12. First, as shown in FIG. 10, in step S21 (the first step), vaporized Taimata™ and Ar as carrier gas are supplied from the second source gas supply unit 18 to the processing vessel 2. In the processing of step S21, the flow rate of Taimata™ is 20 mg/min, and that of Ar as carrier gas is 200 sccm.

In step S21, from the first source gas supply unit 16 for supplying H$_2$ as reducing gas, only Ar is supplied at a flow rate of 100 sccm into the processing vessel 2 through the excitation device 12. This is for preventing Taimata™, which has been supplied to the processing vessel 2, from flowing into the excitation device 12. In case where an opening/closing valve is installed between the processing vessel 2 and the excitation device 12, the supply of Ar from the first source gas supply unit 16 is not necessarily required.

Further, Taimata™ is liquid at room temperature and atmospheric pressure, and it is vaporized by a vaporizer such that the vaporized amount of Taimata™ per unit time (mg/min) from liquid state is used as the unit for flow rate.

Subsequently, in step S22 (the second step), the supplies of Taimata™ and carrier gas Ar are stopped, and H$_2$ as reducing gas and Ar as carrier gas for H$_2$ are supplied from the first source gas supply unit 16 into the processing vessel 2 to purge the inside of the processing vessel 2. At this time, the flow rate of H$_2$ is 200 sccm, and that of Ar is 200 sccm.

If the flows of H$_2$ and Ar to the processing vessel 2 are stabilized in step S22, the processing proceeds to step S23 (third step). In step S23, a high frequency power (RF power) is applied to the excitation device 12 to convert H$_2$ into plasma therein (plasma ignition). In step S23, the flow rate of H$_2$ is 200 sccm, and that of Ar is 200 sccm as well. Here, the reason for supplying Ar as well as H$_2$ into the excitation device 12 is that Ar is effective for increasing the stability of plasma ignition.

If plasma is stabilized in step S23, the processing proceeds into step S24 (fourth step). In step S24, the supply of Ar from the first source gas supply unit 16 is stopped, and only H$_2$ is supplied into the excitation device 12. At this time, the flow rate of H$_2$ is 200 sccm. Further, a high frequency power of 800 W is supplied into the excitation device 12, and H$_2$ that has been converted into the plasma therein is supplied into the processing vessel 2.

The reason for stopping Ar supply in step S24 is for facilitating the diffusion of plasma in the processing vessel 2. To elaborate, Ar is a heavy gas compared to H$_2$, and thus, if Ar is contained in a reducing gas supplied from the center of the processing vessel 2, the diffusion of the reducing gas becomes difficult. Therefore, once the plasma ignition is accelerated by supplying Ar and the plasma is stabilized, the supply of Ar is stopped.

After a specified amount of plasma is supplied into the processing vessel 2 in step S24, the processing proceeds to step S25 (fifth step). In step S25, the supply of gas from the first source gas supply unit 16 is stopped. Accordingly, the supply of all gases into the processing vessel 2 is stopped. Thus, H$_2$ and Ar in the processing vessel 2 are exhausted by the turbo molecular pump 8.

By carrying out the aforementioned steps, the process corresponding to one cycle is completed.

Further, a processing of step S25 involves vacuum-exhausting H$_2$ from inside of the processing vessel 2, but H$_2$ may be exhausted by supplying Ar and purging it. Still further, H$_2$ may be supplied at all times during the aforementioned steps 1~5.

After performing the aforementioned processings 200 cycles at 220° C. of substrate temperature, TaN film with 29 nm of film thickness could be formed. As for the TaN film as formed above, after its C1s spectrum and Ta4f spectrum were examined by using X-ray diffraction and X-ray Photoelectron Spectroscopy (XPS), it could be confirmed that the TaN film as formed above is almost pure TaN.

Next, a process for forming Ta film by using the film forming processing method in accordance with the present invention will be explained.

Figure 12:
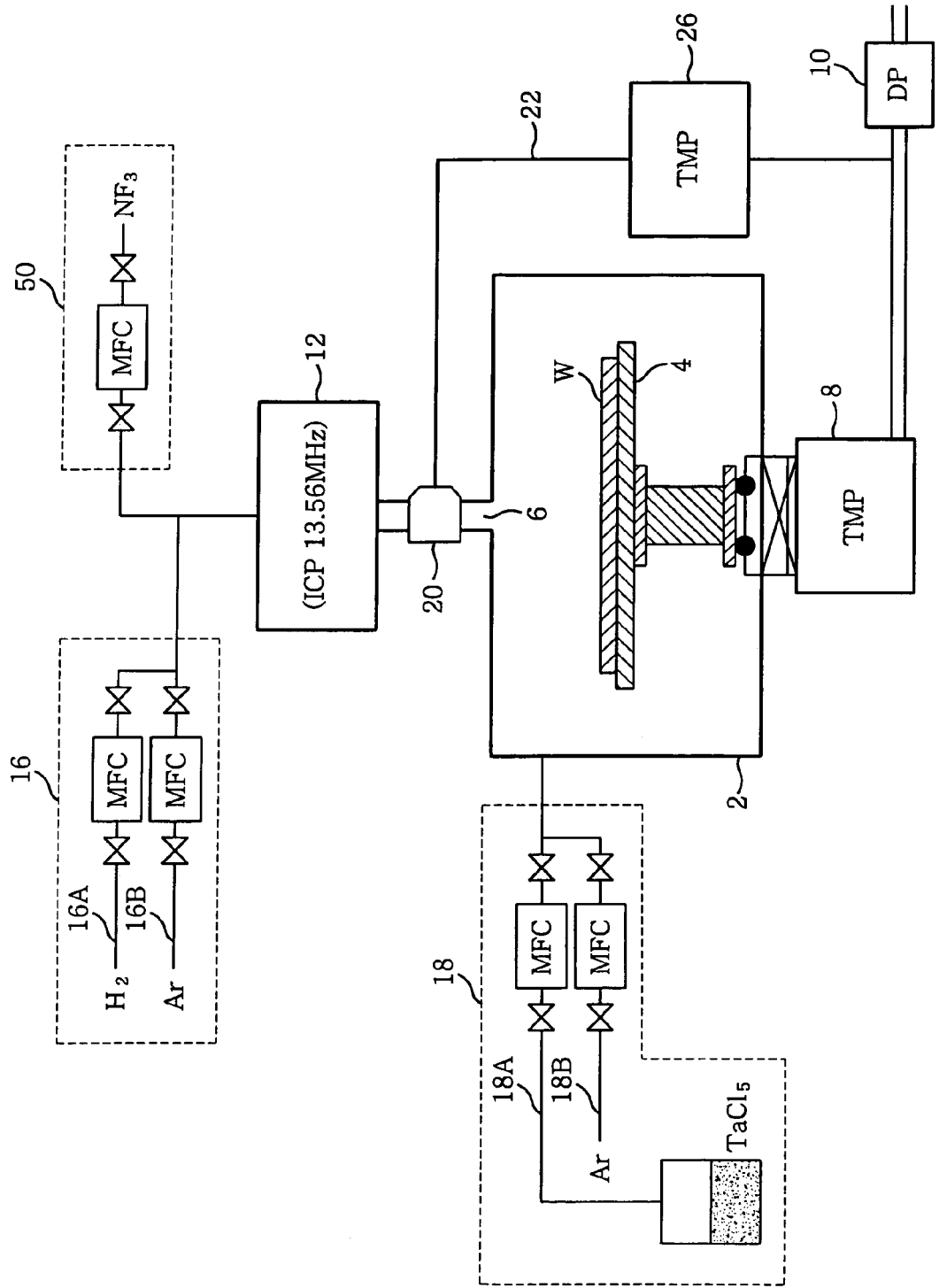
FIG. 12 shows an overall configuration of a processing apparatus in accordance with a fourth embodiment of the present invention.

FIG. 12 shows an overall configuration of a processing apparatus in accordance with a fourth embodiment of the present invention. The processing apparatus shown in FIG. 12 is a film forming processing apparatus for forming a film, particularly, Ta film. In FIG. 12, identical reference numerals will be used for same parts as in FIG. 1, and explanations thereof will be omitted.

In the present embodiment, when forming Ta film, there are used tantalum pentachloride (TaCl$_5$) as source gas, H$_2$ as reducing gas, and Ar as carrier gas.

The processing apparatus in accordance with the present embodiment has the same configuration basically as in FIG. 1, but it is different concerning the supply parts of source and reducing gases. Further, in the apparatus in accordance with the present embodiment, a cleaning mechanism is installed as will be explained below.

In the second source gas supply unit 18, TaCl$_5$ that has been vaporized by sublimation is supplied into the supply line 18A. Further, Ar as carrier gas is supplied into the supply line 18B. The vaporized TaCl$_5$ and carrier gas are supplied into the processing vessel 2 from the second source gas supply unit 18 with a predetermined timing.

Meanwhile, in the first source gas supply unit 16, H$_2$ as reducing gas is supplied into the supply line 16A, and Ar as carrier gas is supplied into the supply line 16B. H$_2$ and Ar are supplied into the excitation device 12 from the first source gas supply unit 16.

H₂ supplied into the excitation device 12 is excited to be converted into plasma, and supplied into the processing vessel 2 through the switching mechanism 20 at a predetermined timing.

The formation of Ta film by using the aforementioned processing apparatus is carried out while the switching mechanism 20 is controlled to allow Ar and H₂, which have been converted into the plasma, to be supplied into the processing vessel 2, in FIG. 12. Therefore, the bypass line 22 is not used.

Figure 13:
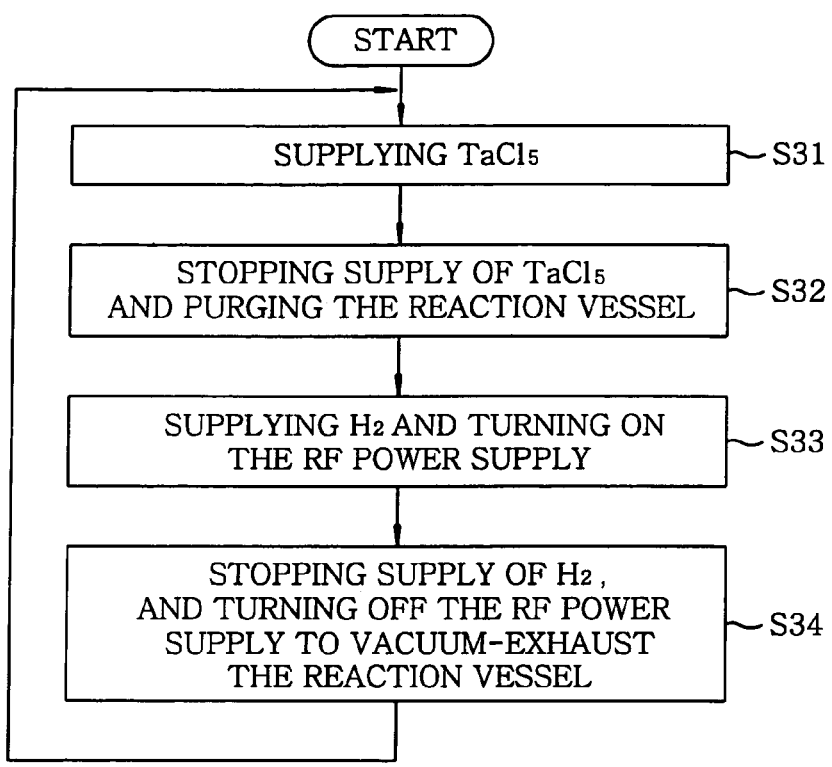
FIG. 13 is a flowchart of source gas supplying operation in the Ta film forming process.

FIG. 13 is a flowchart of source gas supplying operation in a Ta film forming process. FIG. 14 shows a supply amount (flow rate) of source gas and an RF output applied to the excitation device 12. First, as described in FIG. 13, vaporized TaCl₅ and carrier gas Ar are supplied into the processing vessel 2 from the second source gas supply unit 18, in step S31 (first step). In the processing of step S31, the flow rate of TaCl₅ is 3 sccm. Further, Ar with a flow rate of 200 sccm is supplied from the first source gas supply unit 16 as a supply unit of reducing gas. This is for preventing TaCl₅ that has been supplied into the processing vessel 2 from flowing into the excitation device 12. Further, TaCl₅ is a solid at room temperature and atmospheric pressure and it is vaporized by sublimation (it is heated to about 150° C.) to be supplied into the processing vessel 2.

Next, in step S32 (second step), the supplies of TaCl₅ and carrier gas Ar are stopped, and Ar as H₂ carrier gas is supplied from the first source gas supply unit 16 into the processing vessel 2. At this time, H₂ is not supplied yet, and the flow rate of Ar is 200 sccm. The processing of step S32 involves exhausting TaCl₅ from the processing vessel 2 by purging with Ar. Further, it can be configured such the supply of H₂ is started from this step and the flow rate thereof is stabilized in the following step.

If the purging with Ar is completed in step S32, the processing proceeds to step S33 (the third step). In step S33, H₂ with 750 sccm of flow rate is supplied into the processing vessel 2; high frequency power (RF power) of 1000 W is applied to the excitation device 12; and thus, H₂ is converted into plasma in the excitation device 12. In step S33, the supply of Ar is stopped, and only H₂ is supplied into the excitation device 12.

If the supply of plasma is completed in step S33, the processing proceeds to step S34 (the fourth step). In step S34, the supply of H₂ from the first source gas supply unit 16 is stopped. Accordingly, the supply of all gases into the processing vessel 2 is stopped. Thus, H₂ and Ar in the processing vessel 2 are exhausted by the turbo molecular pump 8.

By carrying out the aforementioned steps, the processing correspond to one cycle is completed.

Further, the processing of step S34 involves vacuum-exhausting H₂ from the processing vessel 2, but H₂ may be exhausted by supplying Ar and purging it.

After performing the aforementioned processings 300 cycles at 270° C. of substrate temperature, Ta film of 2.9 nm film thickness could be formed. For the Ta film as formed above, its Ta4f spectrum was examined by using X-ray diffraction and X-ray Photoelectron Spectroscopy (XPS), and therefore, it could be confirmed that the Ta film as formed above is almost pure Ta.

Further, in the Ta film forming process in accordance with the present embodiment, plasma ignition processing for obtaining stabilized plasma is not provided, but plasma ignition processing may be further included between steps S32 (second step) and S33 (third step), in the same manner as in the aforementioned TaN film forming process by the third embodiment. To elaborate, it may be configured such that, between steps S32 (second step) and S33 (third step), H₂ and Ar are supplied into the excitation device 12, and a high frequency power is applied to the excitation device 12 to carry out plasma ignition. Then, if stabilized plasma is stably generated, the processing proceeds to the third step.

In the following, a cleaning mechanism installed in the processing apparatus in the aforementioned third and fourth embodiments will now be discussed.

As described in FIGS. 9 and 12, a cleaning gas supplying unit 50 as cleaning mechanism is connected to the excitation device 12. In the present embodiment, the cleaning gas supply unit 50 supplies NF₃ as cleaning gas into the processing vessel 2 through the excitation device 12, to thereby carry out cleaning on the inner surfaces of the excitation device 12 and the processing vessel 2.

The cleaning is performed independently from the film forming process, e.g., after the predetermined number of substrates is processed. To elaborate, if the predetermined number of substrates is processed, reaction by-products are stuck to the inner surfaces of the processing vessel 2 and the excitation device 12, and thus, cleaning is performed to remove them. In the present embodiment, NF₃ is converted into plasma to be used as cleaning gas. However, NF₃ is a very reactive gas, and reaction by-products stuck to the inner surfaces of the processing vessel 2 and the excitation device 12 react with plasma of NF₃, to thereby be exhausted from the processing vessel 2 as a gas phase.

Further, since plasma of NF₃ is very reactive, there is concern that the inner surface of the processing vessel 2 is eroded if plasma of NF₃ is continuously supplied even after the adhered reaction by-products are removed. Thus, the supply of plasma of NF₃ is controlled based on time, and plasma of NF₃ is supplied into the processing vessel 2 only during the time required for the cleaning. For this, plasma of NF₃ begins to be supplied into the processing vessel 2 when it is stabilized, and it is supplied thereinto for a predetermined time.

FIG. 15 is a table, which explains the cleaning processing performed after 500 sheets of Ta films each having 2 nm of thickness are formed by using the processing apparatus shown in FIG. 12. At the first step of the cleaning processing, NF₃ as cleaning gas and Ar as carrier gas are supplied from the cleaning gas supplying unit 50 into the excitation device 12. In this step, the switching mechanism 20 is controlled to allow NF₃ and Ar to be directed to the bypass line 22. This step is for stably supplying NF₃ and Ar into the excitation device 12 and is performed for about 5 seconds.

Next, high frequency power is applied to the excitation device 12 to convert NF₃ into plasma, in the second step of the cleaning processing. In this step, the switching mechanism 20 is controlled to allow NF₃ and Ar to be directed to the bypass line 22, as well. This step is for plasma ignition and carried out for about 10 seconds.

After plasma of NF₃ is stabilized, the switching mechanism 20 is controlled to allow Ar and NF₃, which have been converted into plasma, to be supplied into the processing vessel 2, in the third step of cleaning processing. This step is for cleaning the inner surface of the processing vessel 2 and is carried out for about 750 seconds. The cleaning period is determined based on the processing time or the number of substrates on which the film forming process has been performed.

After the cleaning is completed, the supply of NF₃ is stopped in the fourth step. Since Ar is continuously supplied, Ar and NF₃ in the processing vessel 2 are simultaneously exhausted. This step lasts for about 30 seconds. Next, in the fifth step, the supply of Ar is stopped. Accordingly, the gas is not supplied into the processing vessel 2, and the processing vessel 2 is vacuum-exhausted. This step lasts for about 30 seconds.

Subsequently, only Ar is supplied again into the processing vessel 2 for about 30 seconds in the sixth step; and the supply of Ar is stopped to vacuum-exhaust the processing vessel for about 30 seconds, in the seventh step. The processings of the fourth and sixth steps are carried out for minimizing residual $NF_3$ as cleaning gas in the processing vessel 2.

By performing the aforementioned steps, the cleaning is completed.

In accordance with the respective embodiments of the present invention, as mentioned above, it is possible to alternately supply source gas and reducing gas while continuously producing plasma of the reducing gas.

While the invention has been shown and described with respect to the preferred embodiments, it will be understood by those skilled in the art that various changes and modifications may be made without departing from the spirit and scope of the invention as defined in the following claims.

What is claimed is:

1. A processing apparatus comprising:
   a plasma excitation device that excites a first gas to be supplied;
   a processing vessel;
   a switching mechanism which includes a cylinder, a rotation valve rotatably provided in the cylinder, and a motor mechanism that rotates the rotation valve; and
   a bypass line connected to the switching mechanism cylinder,
   wherein the cylinder is provided with a first passageway supplied with an excited first gas from the excitation device, a second passageway supplied with a second gas, and a third passageway for supplying the excited first or the second gas into the processing vessel,
      wherein the rotation valve has an annular passageway, formed of a groove-shape and circumferentially formed around almost an entire periphery of the rotation valve except for a portion thereof, for connecting the first passageway to the bypass line; and a central passageway disposed below the annular passageway, having a horizontal passageway extending from a peripheral opening in a side surface of the rotation valve to a center portion of the rotation valve and a connected vertical passageway extending downwards from the center portion to the third passageway along an axis of the rotation valve, for connecting the first or the second passageway to the third passageway,
      wherein the portion and the horizontal passageway are formed so as to be vertically aligned with each other at the same angular position when viewed from above along the axis of the rotation valve, and
      wherein the switching mechanism continuously rotates in one direction to switch a flow path of the excited first gas into the processing vessel, when the first passageway is aligned with the peripheral opening of the horizontal passageway and not with the annular passageway, or into the bypass line, when the first passageway is aligned with the annular passageway and not with the peripheral opening, and to supply the second gas into the processing vessel, when second passageway is aligned with the peripheral opening of the horizontal passageway, thereby alternately supplying the excited first gas and the second gas through the third passageway into the processing vessel.

2. The processing apparatus of claim 1, wherein while the processing vessel is exhausted, the excited first gas flows into the bypass line and the supplying of the second gas is stopped.

3. The processing apparatus of claim 2, wherein during one rotation of the switching mechanism sequentially exhausts the processing vessel, supplies only the second gas, exhausts the processing vessel again, and supplies only the excited first gas.

4. The processing apparatus of claim 1, wherein while the excited first gas flows into the processing vessel, the supplying of the second gas is stopped, and
   wherein while the second gas is supplied into the processing vessel, the excited first gas flows into the bypass line.

5. The processing apparatus of claim 1, wherein the first passageway includes and connects with a first and a second opening and the second passageway has a third opening, the first to third openings being formed on the cylinder.

6. The processing apparatus of claim 5, wherein the annular passageway connects the first opening to the bypass line depending on a rotational position of the rotation valve.

7. The processing apparatus of claim 6,
   wherein while the central passageway connects the second opening to the third passageway, the central passageway does not connect the third opening to the third passageway, and
   wherein while the central passageway connects the third opening to the third passageway, the central passageway does not connect the second opening to the third passageway and the annular passageway connects the first opening to the bypass line.

8. The processing apparatus of claim 5, wherein the central passageway connects the second or the third opening to the third passageway depending on a rotational position of the rotation valve.

9. The processing apparatus of claim 1, wherein the first passageway is aligned with one of the annular passageway and the central passageway.

* * * * *